US008887576B2

(12) United States Patent
Castagna

(10) Patent No.: US 8,887,576 B2
(45) Date of Patent: Nov. 18, 2014

(54) SUBMERSIBLE ELECTRONIC SENSOR

(75) Inventor: Joe Castagna, San Jose, CA (US)

(73) Assignee: S3C, Inc., Sunnyvale, CA (US)

( * ) Notice: Subject to any disclaimer, the term of this patent is extended or adjusted under 35 U.S.C. 154(b) by 294 days.

(21) Appl. No.: 13/429,253

(22) Filed: Mar. 23, 2012

(65) Prior Publication Data

US 2013/0118266 A1 May 16, 2013

Related U.S. Application Data

(60) Provisional application No. 61/560,143, filed on Nov. 15, 2011.

(51) Int. Cl.
*G01L 9/00* (2006.01)

(52) U.S. Cl.
CPC .................................... *G01L 9/00* (2013.01)
USPC ............................................................ 73/753

(58) Field of Classification Search
CPC ........... G01L 9/00; G01L 7/08; G01L 9/0033; G01L 9/16
USPC .................................................... 73/700–756
See application file for complete search history.

(56) References Cited

U.S. PATENT DOCUMENTS 4,310,906 A * 1/1982 Cantrell et al. ............... 367/181
4,335,608 A * 6/1982 Wood et al. ..................... 73/753
5,121,929 A 6/1992 Cobb
5,824,911 A * 10/1998 French ........................... 73/756
7,162,926 B1 1/2007 Guziak et al.
2002/0090749 A1 7/2002 Simmons
2011/0088480 A1 4/2011 Koehler et al.

OTHER PUBLICATIONS

PCT International Search Report and Written Opinion of the International Searching Authority Issued Jan. 31, 2013, Application No. PCT/US2012/063950.

* cited by examiner

*Primary Examiner* — Andre Allen
(74) *Attorney, Agent, or Firm* — Sawyer Law Group, P.C.

(57) ABSTRACT

The invention provides a submersible, electrically-powered sensor assembly that incorporates a flexible seal assembly having operative and non-operative electrical traces of a uniform vertical height for carrying clamping loads and avoiding signal loss along a signal carrying trace due to compression of the flex seal, minimizing fluid leak paths between two flange surfaces, providing stability in compression, and enabling electrical communication in an environment having an operating fluid.

20 Claims, 4 Drawing Sheets

106
102
105
103
100
104
101

SUBMERSIBLE ELECTRONIC SENSOR

CROSS-REFERENCE TO RELATED APPLICATION

This application claims the benefit of U.S. Provisional Patent Application No. 61/560,143, filed on Nov. 15, 2011, entitled "SUBMERSIBLE ELECTRONIC SENSOR," which is incorporated herein by reference in its entirety.

FIELD OF THE INVENTION

The present invention disclosed herein relates generally to pressure sensing technology and more particularly to sealable sensor-associated devices having electrical and electronic connections.

BACKGROUND OF THE INVENTION

Many mechanical systems, such as those found in the automotive field for instance, are integrated into operating environments that realize high temperatures, pressures and the presence of fluids, each of which often is proximate to an electrical assembly. Monitoring the conditions of various aspects of systems in these types of applications using electronics presents challenges for designers and system providers, in part, as the viability of these components and their associated connectivity in such environments may be inadvertently compromised. Similarly, despite such environments, there exists a need to measure and convert certain physical characteristics into electrical signals for monitoring and control purposes. In some cases, the need to convert certain physical phenomena into electrical signals requires the electronics (i.e., sensor assembly) to be immersed or submerged in fluids of the environment.

For instance, in the automotive environment, there is a need to provide pressure sensors to determine various hydraulic transmission fluid (hereafter referred to as ATF) pressures during operation of an automatic, automated manual, dual clutch, or other electronically controlled transmission. To determine such data characteristics regarding pressure of the ATF for the operation, a pressure sensing device is often submerged in the ATF. (In some designs, the fluid measured is separate from the ATF in the sump.) These pressure sensing devices provide the determined pressure data as electrical signals (i.e. digital data) to receiving devices while the pressure sensing devices are actively submerged in the transmission sump. While in the transmission sump, these pressure sensing devices are often subjected to both extremes of high and low temperatures of the ATF, as well as the chemical lubricating and penetrating properties of the engineered fluids present (i.e., operating fluids). The submerging of a pressure sensor in the ATF causes these types of sensing devices, and more specifically the electronics and connectivity of such sensors, to become prematurely damaged, particularly over time. Therefore, it is highly desired that the internal workings (i.e. electronics and electrical connectivity) of the sensors be protected from the environment and more specifically from fluid penetration to ensure the operational reliability of these critical sensors as designed. This desire however, presents challenges beyond basic sealing of the sensor as fully sealed sensors often still require electrically electrical connectivity with the electronic components within the sensor to an external power source as well as electrical communication signal lines to pass information to other components.

For instance, it is generally known that a common method of sealing is to first employ a connector body that uses plastic over molded materials such as polybutylene terephthalate (PBT) or polyphenylene sulfide (PPS) to rigidly locate one or more metallic connector pins; and then seal the connector body to the remaining sensor structure containing the necessary sensing element and electronics using one or more elastomeric O-rings. Although this technique is plausible, it is not useful for the present exemplary situation and is further limited in its applications.

In some situations, there have been attempts to build on the basic limited approach by employing additional elastomeric O-rings, to seal the connector body to its mating electrical connector, and/or to further use a secondary sealing process such as vacuum impregnation of the voids between the metallic pins and over molded plastic or epoxy potting, to prevent fluid penetration along the pins. However, significant resources, costs and time are expended on plastic, epoxy, and elastomeric materials development and selection choices to meet the sealing requirements at the extremes of temperature experienced in the automotive industry, for example, making this approach overly complex, limited in its application and deficient in efficiencies.

Accordingly, what is desired is a cost-effective solution for providing reliable and accurate pressure data measurements from pressure sensing devices submerged in operating fluids while satisfying requirements for fluid resistance and electrical connection integrity of the submerged components.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment.

SUMMARY OF THE INVENTION

The present invention fulfills these needs and has been developed in response to the present state of the art, and in particular, in response to the problems and needs in the art that have not yet been fully solved by currently available technologies.

One embodiment of the present invention provides for a sensor assembly, capable of being submersed, comprising: a plurality of electrical pathways on a flex seal; a plurality of flange surfaces including a first flange surface and second flange surface in conformance to accommodate the flex seal; an in-place sealant for securably sealing the flex seal with the plurality of flange surfaces; and at least one sensor capable of sensing one or more data characteristics; wherein the plurality of electrical pathways include at least one signal carrying pathway and at least one non-signal carrying pathway arranged at an equivalent relative height to one another for providing sealing integrity of the assembly.

Another embodiment of the present invention includes a micro-electromechanical system (MEMS) capable of being submerged in an operating fluid, comprising: a plurality of electrical traces on a flex seal; a plurality of flange surfaces including a first flange surface and second flange surface in conformance to accommodate the flex seal; an in-place sealant for securably sealing the flex seal with the plurality of flange surfaces; and at least one sensor capable of sensing one or more data characteristics; wherein the first flange surface, the second flange surface and the flex seal are configured to be alignably compressed with one another to form a seal; wherein the plurality of electrical traces includes at least one signal carrying trace and at least one non-signal carrying trace arranged at a uniform vertical height for carrying clamping loads of the assembly and avoiding signal loss along a signal carrying pathway due to compression of the flex seal.

A further embodiment of the present invention provides for a submersible pressure sensing assembly, comprising: at least one operative electrical pathway and at least one non-operative electrical pathway on a compressible flex seal, each electrical pathway being of a uniform vertical height for carrying clamping loads of the assembly and avoiding signal loss along a signal carrying pathway due to compression of the flex seal; a first flange surface and second flange surface alignably arranged to be compressible attached in contact with an interface being the flex seal; an in-place sealant for securably sealing the flex seal as the interface; and at least one pressure sensor capable of sensing one or more pressure data characteristics and being in electrical communication along the at least one operative electrical pathway.

Operatively, when submerged, the present invention provides a purpose designed flexible circuit assembly that forms the electrical circuit necessary to pass electrical signals, in communication, with the sealed sensor assembly and includes features incorporated therein to affect a complete seal preventing fluid penetration in to the sensor assembly when combined with a form in place gasket material. By combining the sealing and connection functions in a unique embodiment, the invention presented herein provides a sealing design that meets the requirements of fluid resistance and electrical connection in a novel and practical arrangement.

Further embodiments, forms, objects, features, advantages, aspects, and benefits of the present application shall become apparent from the detailed description and drawings included herein.

DETAILED DESCRIPTION

The present invention disclosed herein relates generally to pressure sensing technology and more particularly to sealable sensor-associated devices having electrical and electronic connections.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The invention, in one or more embodiments, provides a submersible, electrically-powered sensor assembly that incorporates a flexible seal assembly having operative and non-operative electrical traces of a uniform vertical height for carrying clamping loads and avoiding signal loss along a signal carrying trace due to compression of the flex seal, minimizing fluid leak paths between two flange surfaces, providing stability in compression, and enabling electrical communication in an environment having an operating fluid.

Figure 1:
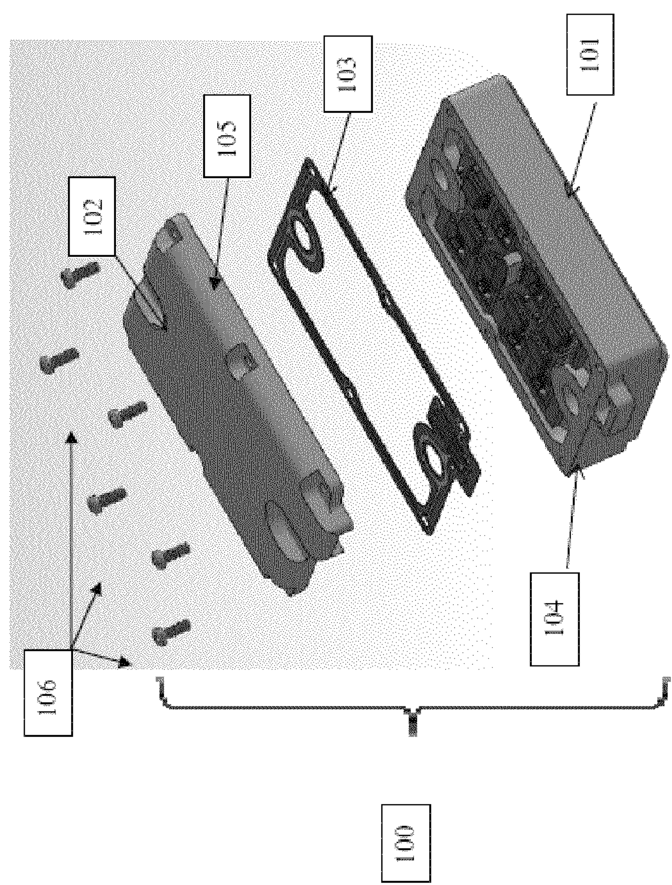
FIG. 1 depicts an overall structure of a submersible pressure sensor assembly designed in accordance with an aspect of the present invention.

From FIG. 1, the submersible sensor assembly 100, includes a sensor housing 101, a housing cover 102 and a flex cable seal assembly 103 (i.e., flex seal). Housing 101 and cover 102 each have a flange surface 104, 105 which configured to be adapted to one another such that when one is placed over the other, there is a well-suited alignment. Additionally, the configuration of flange surfaces 104, 105 of housing 101 and cover 102 are also configured with the shape of the flex seal 103 such that the flanges 104, 105 may be alignably placed into contact with the flex seal 103. In a, preferred embodiment housing 101 and cover 102 are fabricated from 6061 aluminum.

Figure 2:
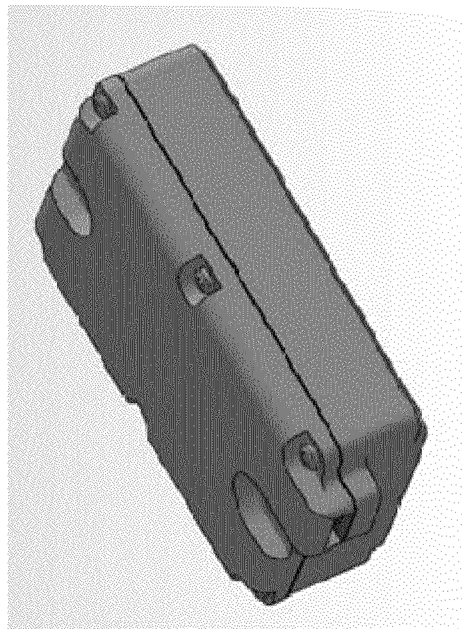
FIG. 2 presents a submersible assembly ready for use in accordance with an aspect of the present invention.
Figure 2:
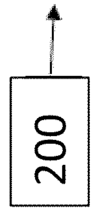

A leak proof seal between housing flange 104 and cover flange 105 is achieved when flex seal assembly 103 is positioned between flanges 104 and 105 and a form in place sealant such as Loctite® 518 applied to the upper and lower surfaces of flex assembly 103 such that the interface between housing 101 and cover 102 is formed of housing flange 104, form in place sealant (not pictured), flex seal 103, form in place sealant (not pictured), and cover flange 105 (Loctite® is a registered trademark of Henkel Corporation, U.S.A). This joined combination, as is set forth in FIG. 2 at 200, is preferably compressed together under a vertical load provided by a number of compression fittings or external pressures. In a preferred embodiment, cover screws 106 of FIG. 1 (i.e., compression fittings example) are utilized.

Figure 3:
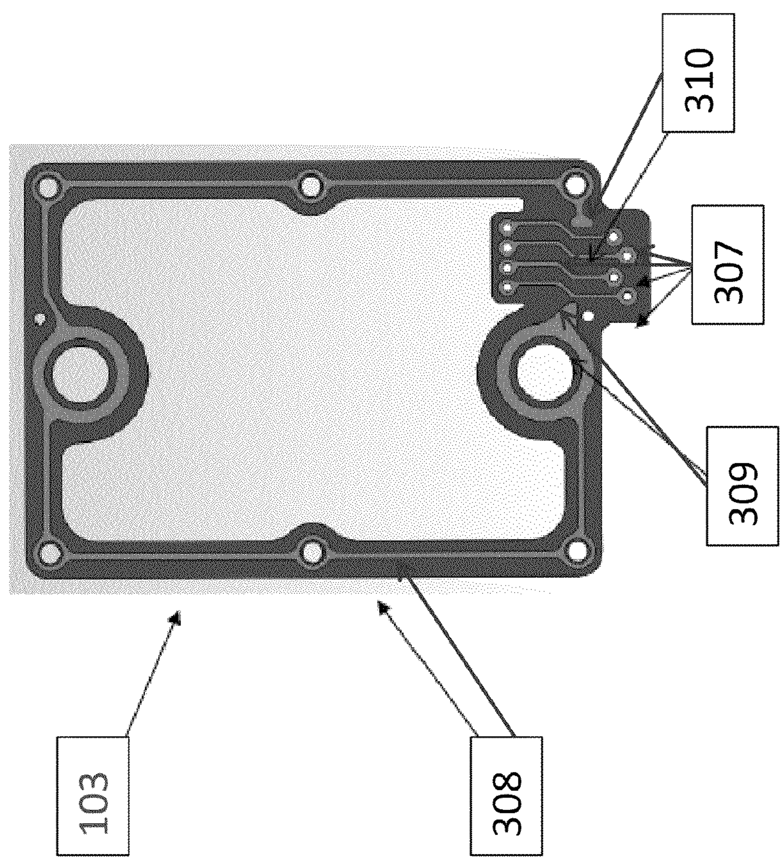
FIG. 3 illustrates a flexible seal of the present invention.

As set forth in FIG. 3, flex cable seal 103 is comprised of several layers of conductive and non-conductive material. In a preferred embodiment flex assembly 103 is comprised of a 0.005" thick polyimide stiffener, 0.001" thick adhesive, 0.001" thick polyimide film, 0.0007" copper, 0.001" thick adhesive, and a 0.001" thick polyimide cover layer. Conductive traces (preferably of copper) are formed within flex seal assembly 103. The traces are comprised of signal carrying traces 307 and non-signal carrying traces 308. The number and combination of signal carrying traces 307 and non-signal carrying traces 308 is not limited by the present invention. The functions of traces 308 are to provide stability to the flex seal assembly 103 under compressive load, provide uniform vertical gasket height, and carry significant clamping loads near the signal carrying traces 307 to prevent signal loss due to trace compression. To aid in load bearing capabilities near the signal carrying traces 307, bulk features 309, 310 are added to non-signal carrying traces 308. It is understood that other embodiments of this invention may use other arrangements and shapes to reduce compressive loads on signal carrying traces 307. To further aid in the sealing and load carrying capacity of the flex seal, the trace 307 may have non straight paths.

In a preferred embodiment, each of the signal carrying pathways and the non-signal carrying pathways are arranged to be an equivalent relative height to one another. In this manner the equivalent relative height enhances sealing integrity along the flange surfaces while the assembly is being placed into compression. In general then, in one or more preferred embodiments, the thickness of the flex seal is of a dimensional value at least slightly more than the height of a pathway or trace.

Certain features of the present invention, such as in its provision of certain beneficial sealing features of the flex seal (e.g., non-signal carrying traces) further provide for a variety of benefits. For example the non-signal carrying traces within the flex cable are preferably at the same feature height as the in-circuit electrical traces so that the flex seal or flexible cable assembly may be used as a gasket between two flange surfaces in compression without over stressing the electrical traces. Additionally the non-signal carrying traces provide further stability to the composition of the flex material and transmit a concentrated loading along a portion of the gasket path, thereby minimizing the fluid leak path.

It will be appreciated by those skilled in the art that a form in place sealant material, such as Loctite® 518 may be used in conjunction with the compression process to complete the sealing and simultaneously provide a seal in entirety in regions where both the electrical traces are necessarily be separated from each other and as well from the non-electrical traces.

In a further preferred embodiment, the present invention is applicable to vacuum seal gauge type pressure sensors, forming low cost absolute pressure sensors. A preferred embodiment includes MEMS (Micro Electro Mechanical sensors) type gauge pressure sensor elements. In one embodiment of the invention, the sensor may be one of a MEMS sensor selected from the group consisting of MEMS based pressure sensors, MEMS incorporating circuit elements, and combinations thereof.

In a further preferred aspect of the present invention, the flex seal assembly is used to complete the vacuum seal on the backside of the sensing elements, enabling the sensors to reference vacuum. In various embodiments, the vacuum cavity sealed by the flex seal assembly may contain one or more sensors, with signal carrying traces for the sensors integrally formed within one flex cable sensor assembly.

Figure 4:
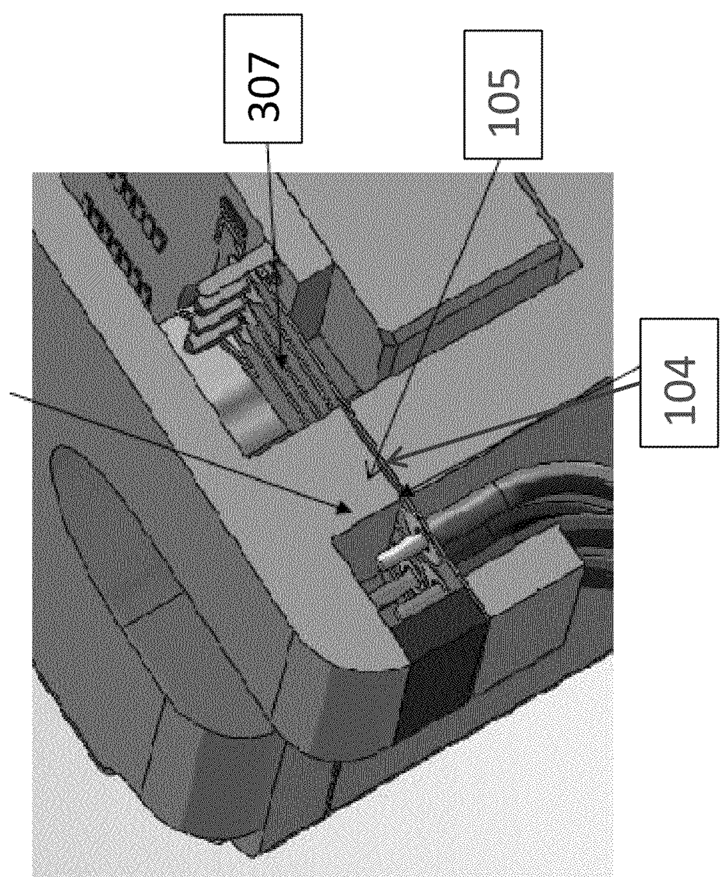
FIG. 4 sets forth a communication path of signal carrying traces passing between a cover and housing flanges.

It will be further appreciated by those skilled in the art that the present invention, in one or more embodiments, provides for a rugged, compact sensing device designed to meet the needs of automotive, marine, and other industries that require low cost accurate pressure sensing while immersed in the operating fluid. Further, the present invention provides for a purpose designed flexible circuit assembly that forms the electrical circuit communications necessary to pass electrical signals into the sealed sensor assembly and includes features incorporated within the flexible circuit necessary to effect a complete seal to prevent fluid penetration in to the sensor assembly when combined with a form in place gasket material. For instance, as set forth in FIG. 4, detail demonstrating electrical communication of signal carrying traces 307 passing between the cover flange 105 and housing flanges 104, while the assembly is being or in compression, is depicted.

The present invention also further advances the design of submersible electronic sensors by incorporating the sealing and electrical connection functions into a flexible cable assembly (i.e. flex seal) that functions to provide sealing and electrical connection passing between two flange surfaces. Preferably, the composition of materials used for fabrication of this flexible seal are by design resistant to deterioration from prolonged exposure to the penetrating and solvent effects of the operating fluid, and for a specific implementation such as those that include ATF.

As used herein, the term "compression fittings" is intended to include structural, mechanical, and/or magnetic support, devices and designs for enabling the configured alignment of a first flange, a second flange, and the flex seal to be alignably compressed with one another, forming a seal. Examples of such, which are not intended to be limiting, include: screws, magnets, compression clamps, clasps, bolts, pins, etc.

Although the present invention has been described in accordance with the embodiments shown, one of ordinary skill in the art will readily recognize that there could be variations to the embodiments and those variations would be within the spirit and scope of the present invention. The present invention disclosed herein may be configured in variety of ways including but not limited to a rugged, compact sensing device designed to meet specific needs and/or conformities for automotive, marine, and other industries that require low cost accurate pressure sensing while immersed in the operating fluid. Accordingly, many modifications may be made by one of ordinary skill in the art without departing from the spirit and scope of the present invention.

Although the foregoing described the invention with preferred embodiments, this is not intended to limit the invention. Indeed, embodiments of this invention can be combined with other sensors and systems, such as other temperature, fluid leveling, filtration and similar sensors. As seen from the foregoing, the embodiments of the present invention are intended to be used as a sensor assembly or in combination with other types of sensors. In this regard, the foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

What is claimed is:

1. A sensor assembly, capable of being submersed, comprising: a plurality of electrical pathways on a flex seal; a plurality of flange surfaces including a first flange surface and second flange surface in conformance to accommodate the flex seal; an in-place sealant for securably sealing the flex seal with the plurality of flange surfaces; and at least one sensor for sensing one or more data characteristics; wherein the plurality of electrical pathways include at least one signal carrying pathway and at least one non-signal carrying pathway arranged at an equivalent relative height to one another for providing sealing integrity of the assembly.

2. The sensor assembly of claim 1, wherein the plurality of electrical pathways are arranged at a uniform vertical height for carrying clamping loads of the assembly and avoiding signal loss along a signal carrying pathway due to compression of the flex seal.

3. The sensor assembly of claim 2, wherein one or more bulk features are integral to the non-signal carrying pathway and the plurality of electrical pathways are situated on the flex seal proximate to a sealable contact area as between the first flange surface and the second flange surface.

4. The sensor assembly of claim 3, wherein minimally one sensor is to be powered by a power source external to the assembly.

5. The sensor assembly of claim 4, wherein the flex seal is adaptively formed to be sealably situated with the first flange surface and the second flange surface and provide electrical connectivity capability along the plurality of electrical pathways.

6. The sensor assembly of claim 5, wherein the electrical pathways are electrical copper traces.

7. The sensor assembly of claim 6, wherein the signal carrying pathway is comprised of a plurality of in-circuit electrical pathways.

8. The sensor assembly of claim 5, wherein the relative height is of a height value less than the thickness of the flex seal.

9. The sensor assembly of claim 8, wherein the flex seal is a compressible gasket.

10. The sensor assembly of claim 8, wherein the in-place sealant is a sealing agent.

11. The sensor assembly of claim 10, wherein the at least one sensor is situated in an interior cavity side.

12. The sensor assembly of claim 10, wherein the assembly is submerged.

13. The sensor assembly of claim 10, is operatively connected to a receiving device in electrical communication.

14. The sensor assembly of claim 12, wherein the in-place sealant is a sealing agent of a composition chemically-suited to resist the operating fluid.

15. The sensor assembly of claim 14, wherein at least one electrical pathway comprises non-linear trace paths.

16. The sensor assembly of claim 14, wherein at least one electrical pathway comprises non-linear, non-operative trace paths.

17. A micro-electromechanical system (MEMS) capable of being submerged in an operating fluid, comprising: a plurality of electrical traces on a flex seal; a plurality of flange surfaces including a first flange surface and second flange surface in conformance to accommodate the flex seal; an in-place sealant for securably sealing the flex seal with the plurality of flange surfaces; and at least one sensor for sensing one or more data characteristics; wherein the first flange surface, the second flange surface and the flex seal are configured to be alignably compressed with one another to form a seal; wherein the plurality of electrical traces includes at least one signal carrying trace and at least one non-signal carrying trace arranged at a uniform vertical height for carrying clamping loads of the assembly and avoiding signal loss along a signal carrying pathway due to compression of the flex seal.

18. The MEMS of claim 17, wherein the first flange surface, the second flange surface and the flex seal are adaptively configured to be compressed with one another to form a secure seal using compression fittings, and wherein one or more bulk features are integral to the non-signal carrying trace.

19. A submersible pressure sensing assembly, comprising: at least one operative electrical pathway and at least one non-operative electrical pathway on a compressible flex seal, each electrical pathway being of a uniform vertical height for carrying clamping loads of the assembly and avoiding signal loss along a signal carrying pathway due to compression of the flex seal; a first flange surface and second flange surface alignably arranged to be compressible attached in contact with an interface being the flex seal; an in-place sealant for securably sealing the flex seal as the interface; and at least one pressure sensor for sensing one or more pressure data characteristics and being in electrical communication along the at least one operative electrical pathway.

20. The pressure sensing assembly of claim 19, submerged in an operating fluid and connected to a receiving device in electrical communication with the sensor assembly, the pressure sensor being powered from an external power source, wherein the in-place sealant is a sealing agent of a composition chemically-suited to resist the operating fluid.

* * * * *